A nitride semiconductor ultraviolet light-emitting element is provided with: an underlying structure portion including a sapphire (0001) substrate and an AlN layer formed on the substrate; and a light-emitting element structure portion including an n-type cladding layer of an n-type AlGaN based semiconductor layer, an active layer having an AlGaN based semiconductor layer, and a p-type cladding layer of a p-type AlGaN based semiconductor layer, formed on the underlying structure portion. The (0001) surface of the substrate is inclined at an off angle which is equal to or greater than 0.6° and is equal to or smaller than 3.0°, and an AlN molar fraction of the n-type cladding layer is equal to or higher than 50%.

(12) United States Patent
Pernot et al.

(10) Patent No.: US 9,502,606 B2
(45) Date of Patent: Nov. 22, 2016

(54) NITRIDE SEMICONDUCTOR ULTRAVIOLET LIGHT-EMITTING ELEMENT

(71) Applicant: SOKO KAGAKU CO., LTD., Aichi (JP)

(72) Inventors: Cyril Pernot, Aichi (JP); Akira Hirano, Aichi (JP)

(73) Assignee: SOKO KAGAKU CO., LTD., Aichi (JP)

( * ) Notice: Subject to any disclaimer, the term of this patent is extended or adjusted under 35 U.S.C. 154(b) by 0 days.

(21) Appl. No.: 15/140,300

(22) Filed: Apr. 27, 2016

(65) Prior Publication Data

US 2016/0240727 A1 Aug. 18, 2016

Related U.S. Application Data

(63) Continuation of application No. 14/237,731, filed as application No. PCT/JP2011/068165 on Aug. 9, 2011, now Pat. No. 9,356,192.

(51) Int. Cl.
 *H01L 33/32* (2010.01)
 *H01L 21/20* (2006.01)
 (Continued)

(52) U.S. Cl.
 CPC ............ *H01L 33/007* (2013.01); *H01L 33/06* (2013.01); *H01L 33/12* (2013.01); *H01L 33/16* (2013.01); *H01L 33/18* (2013.01); *H01L 33/24* (2013.01); *H01L 33/32* (2013.01);
 (Continued)

(58) Field of Classification Search
 CPC ....... H01L 33/12; H01L 33/16; H01L 33/32; H01L 21/02433; H01L 21/02458; H01L 21/0254
 See application file for complete search history.

(56) References Cited

U.S. PATENT DOCUMENTS 6,252,255 B1 * 6/2001 Ueta ................... H01L 21/0242
 257/94
7,498,182 B1 * 3/2009 Sampath ................ B82Y 20/00
 438/21
(Continued)

FOREIGN PATENT DOCUMENTS

JP H0923026 A 1/1997
JP 2000156341 A 6/2000
(Continued)

OTHER PUBLICATIONS

Ponce et al., "Crystalline structure of AlGaN epitaxy on sapphire using AlN buffer layers," Applied Physics Letters, American Institute of Physics, US, vol. 65, No. 18, Oct. 31, 1994, pp. 2302-2304.

*Primary Examiner* — Marvin Payen
*Assistant Examiner* — Jeremy Joy
(74) *Attorney, Agent, or Firm* — Haynes Beffel & Wolfeld LLP

(57) ABSTRACT

A nitride semiconductor ultraviolet light-emitting element is provided with: an underlying structure portion including a sapphire (0001) substrate and an AlN layer formed on the substrate; and a light-emitting element structure portion including an n-type cladding layer of an n-type AlGaN based semiconductor layer, an active layer having an AlGaN based semiconductor layer, and a p-type cladding layer of a p-type AlGaN based semiconductor layer, formed on the underlying structure portion. The (0001) surface of the substrate is inclined at an off angle which is equal to or greater than 0.6° and is equal to or smaller than 3.0°, and an AlN molar fraction of the n-type cladding layer is equal to or higher than 50%.

5 Claims, 13 Drawing Sheets

(51) Int. Cl.
- *H01L 33/12* (2010.01)
- *H01L 33/00* (2010.01)
- *H01L 33/16* (2010.01)
- *H01L 33/06* (2010.01)
- *H01L 33/24* (2010.01)
- *H01L 33/18* (2010.01)
- *H01L 21/02* (2006.01)
- *H01L 33/38* (2010.01)

(52) U.S. Cl.
CPC .... *H01L 21/0254* (2013.01); *H01L 21/02433* (2013.01); *H01L 21/02458* (2013.01); *H01L 33/38* (2013.01)

(56) References Cited

U.S. PATENT DOCUMENTS

| | | | |
|---|---|---|---|
| 7,687,382 B2 * | 3/2010 | Nakamura | C30B 25/02 117/952 |
| 7,811,847 B2 | 10/2010 | Hirayama et al. | |
| 9,356,192 B2 | 5/2016 | Pernot et al. | |
| 2005/0285136 A1 * | 12/2005 | Ou | H01L 33/22 257/103 |
| 2009/0057646 A1 * | 3/2009 | Hirayama | H01L 21/0237 257/13 |
| 2009/0136780 A1 * | 5/2009 | Shibata | C30B 29/403 428/698 |
| 2009/0246944 A1 | 10/2009 | Keller et al. | |
| 2009/0254944 A1 * | 10/2009 | Watson | H04M 19/04 725/58 |
| 2011/0147763 A1 * | 6/2011 | Hanawa | B82Y 20/00 257/76 |
| 2012/0049156 A1 * | 3/2012 | Ohta | H01L 21/0237 257/13 |
| 2012/0145991 A1 * | 6/2012 | Nam | H01L 33/007 257/13 |

FOREIGN PATENT DOCUMENTS

| | | | |
|---|---|---|---|
| JP | 2000156348 A | | 6/2000 |
| JP | 2001158691 A | | 6/2001 |
| JP | 2006060164 A | * | 3/2006 |
| JP | 2009054780 A | | 3/2009 |
| JP | 2009147271 A | | 7/2009 |
| WO | 2008060531 A2 | | 5/2008 |
| WO | 2009048131 A1 | | 4/2009 |
| WO | 2011025290 A2 | | 3/2011 |

* cited by examiner

| | Twist FWHM (arcsec) | Light-Emitting Output (mW) | FWHM of Emission Wavelength Distribution (nm) |
|---|---|---|---|
| Comparative example 3 | 603 | 3.2 | 11.79 |
| Comparative example 1 | 549 | 3.9 | 11.37 |
| Example 1 | 437 | 4.8 | 18.16 |

| | Twist FWHM (arcsec) | Light-Emitting Output (mW) | FWHM of Emission Wavelength Distribution (nm) |
|---|---|---|---|
| Comparative example 2 | 624 | 2.7 | 10.4 |
| Example 3 | 557 | 3 | 10.7 |
| Example 2 | 502 | 3.2 | 11.64 |

Fig. 13

NITRIDE SEMICONDUCTOR ULTRAVIOLET LIGHT-EMITTING ELEMENT

CROSS-REFERENCE TO RELATED APPLICATIONS

This application is a continuation of U.S. patent application Ser. No. 14/237,731 filed on 7 Feb. 2014 (now U.S. Pat. No. 9,356,192); which application is a National Phase filing under 35 U.S.C. §371 of International Application No. PCT/JP2011/068165 filed on Aug. 9, 2011.

TECHNICAL FIELD

The present invention relates to a nitride semiconductor light-emitting element obtained by forming an n-type cladding layer, an active layer and a p-type cladding layer, each of which is an AlGaN based semiconductor layer, above a sapphire (0001) substrate, and more particularly to a nitride semiconductor ultraviolet light-emitting element having a peak emission wavelength region in an ultraviolet region.

BACKGROUND ART

Conventionally, there are a large number of light-emitting structures in which nitride semiconductor light-emitting elements such as LEDs (light-emitting diodes) or semiconductor lasers use a sapphire (0001) substrate as a substrate and a plurality of nitride semiconductor layers are formed on the substrate by an epitaxial growth. The nitride semiconductor layer is expressed in a general formula of $Al_{1-x-y}Ga_xIn_yN$ ($0 \le x \le 1$, $0 \le x+y \le 1$).

As the sapphire (0001) substrate, a slightly inclined substrate having a (0001) surface inclined slightly with an off angle of approximately 0.05° to 0.5° is generally used rather than a non-inclined substrate having a (0001) surface which is not inclined at all with an off angle of zero degree, on the assumption that a surface property or crystallinity of a nitride semiconductor layer to be epitaxially grown is enhanced (for example, see the following Patent Document 1 and Patent Document 2).

The light-emitting element structure has a double heterostructure in which an active layer is interposed between an n-type nitride semiconductor layer and a p-type nitride semiconductor layer. The active layer is constituted by a nitride semiconductor layer having a single quantum well (SQW) structure or a multi quantum well (MQW) structure. In the case in which the active layer is an AlGaN based semiconductor layer, it is possible to regulate a band gap energy within a range, lower and upper limits of which are band gap energies that can be taken by GaN and AlN respectively (approximately 3.4 eV and approximately 6.2 eV) by adjusting an AlN molar fraction (which is also referred to as an AlN composition ratio). Thus, it is possible to obtain an ultraviolet light emitting element having an emission wavelength of approximately 200 nm to 365 nm.

Prior Art Document

Patent Documents

Patent Document 1: JP 2000-156348 A
Patent Document 2: JP 2001-158691 A

DISCLOSURE OF THE INVENTION

Problems to be Solved by the Invention

The following matters can be assumed as a background in which a sapphire (0001) substrate having an off angle of approximately 0.05° to 0.5° is generally used.

As schematically shown in FIG. 1, the slightly inclined substrate is a stepped substrate having a step S between terrace surfaces T obtained by inclination of (0001) surfaces. If an off angle θ is increased, a width W of the terrace surface T is reduced. As shown in FIG. 1, the off angle θ is defined as an angle formed by a line connecting upper ends or lower ends of the steps S and the terrace surface T. An RMS (root mean square) value of concavo-convex portions of the surface of the nitride semiconductor layer formed on a general sapphire (0001) substrate having an off angle of approximately 0.05° to 0.5° is usually equal to or smaller than 0.4 nm. When the off angle is increased to exceed 0.5°, however, there is a possibility that the RMS value might be increased to exceed 0.4 nm. On the other hand, a film thickness of a quantum well layer constituting an active layer is usually equal to or smaller than 5 nm. If the off angle is excessively increased, a fluctuation in the film thickness of the quantum well layer is increased so that light emission performance of a light-emitting element might be influenced.

In the case in which the substrate surface is stepped, furthermore, the nitride semiconductor layer to be grown thereon is also stepped to follow the property of the substrate surface. Since Ga has great migration, it easily moves to the terrace surface at a lower side beyond the step portion. For this reason, segregation of Ga occurs in a composition of the nitride semiconductor layer which is grown. In an AlGaN based semiconductor, consequently, an AlGaN region having a high AlN molar fraction and an AlGaN region having a low AlN molar fraction are generated along the step portion. As a result, if the off angle is increased, there is a possibility that a light emission from the active layer might have wider spread wavelength distribution and separated peaks of emission wavelength.

As described above, the nitride semiconductor light-emitting element using the sapphire (0001) substrate and having an off angle of approximately 0.05° to 0.5° is generally utilized, and is mainly adapted to a light-emitting element having a greater emission wavelength than approximately 365 nm in the case in which an active layer is constituted by a GaN or InGaN based semiconductor (for example, see the Patent Document 1 and the Patent Document 2). In an ultraviolet light-emitting element having a smaller emission wavelength than approximately 365 nm, it was not sufficiently considered in the past whether the off angle within the range of approximately 0.05° to 0.5° is optimum or not.

In consideration of the above-mentioned problem, an object of the present invention is to improve crystal quality of the AlGaN based semiconductor layer formed on the sapphire (0001) substrate by optimizing the off angle and to enhance a light-emitting output of the nitride semiconductor ultraviolet light-emitting element.

Means for Solving the Problem

The inventors of the present application earnestly studied and found that an excellent light-emitting output is obtained in a state in which a full width at half maximum (FWHM) of a twist distribution evaluated by an X-ray rocking curve (XRC) method of an AlGaN layer formed on a sapphire (0001) substrate is equal to or smaller than a predetermined value in a relationship between crystallinity indicated by the FWHM and a light-emitting output of an ultraviolet light-emitting element output from a light-emitting element structure containing the AlGaN, and furthermore found that an off angle at which the FWHM of the twist distribution is equal to or smaller than the predetermined value has AlN molar fraction dependency of AlGaN to be used in an n-type cladding layer.

The present invention has been made based on the new knowledge and provides a nitride semiconductor ultraviolet light-emitting element including: an underlying structure portion including a sapphire (0001) substrate and an AlN layer formed on a (0001) surface of the substrate; and a light-emitting element structure portion including an n-type cladding layer of an n-type AlGaN based semiconductor layer, an active layer having an AlGaN based semiconductor layer, and a p-type cladding layer of a p-type AlGaN based semiconductor layer, the light-emitting element structure portion formed on a crystal surface of the underlying structure portion, wherein the (0001) surface of the substrate is inclined at an off angle which is equal to or greater than 0.6° and is equal to or smaller than 3.0°, and an AlN molar fraction of the n-type cladding layer is equal to or higher than 50%.

According to the present invention, the AlGaN based semiconductor is a group-III nitride semiconductor that is based on a ternary (or binary) compound expressed in the general formula of $Al_xGa_{1-x}N$ (x represents an AlN molar fraction, $0 \leq x \leq 1$) and has a band gap energy within a range, lower and upper limits of which are band gap energies (approximately 3.4 eV and approximately 6.2 eV) of GaN (x=0) and AlN (x=1) respectively. As long as a condition related to the band gap energy is satisfied, there is also included the case in which a very small quantity of In is contained.

According to the nitride semiconductor ultraviolet light-emitting element having the feature described above, in the case in which the AlN molar fraction of the n-type cladding layer is equal to or higher than 50%, it is possible to considerably increase a probability that the FWHM of the twist distribution indicative of the crystallinity of the n-type AlGaN layer to be an upper layer on an AlN layer of an underlying structure portion might be equal to or smaller than a predetermined value, thereby enhancing a light-emitting output with a high yield within a range of 0.6° to 3.0° which greatly exceeds a range of an off angle used generally in the related art.

In addition, in the nitride semiconductor ultraviolet light-emitting element, the off angle is preferably equal to or greater than 1.0° and is equal to or smaller than 2.5°. Consequently, it is possible to further improve the crystallinity of the AlGaN layer, thereby enhancing a light-emitting output stably with a higher yield.

In addition, in the nitride semiconductor ultraviolet light-emitting element, a peak emission wavelength is preferably equal to or smaller than 300 nm. As described above, since the sapphire (0001) substrate within a range in which the off angle is equal to or greater than 0.6° and is equal to or smaller than 3.0° has the stepped (0001) surface, the segregation of Ga occurs in the AlGaN semiconductor layer formed on the substrate so that an emission wavelength distribution spreads. The spread of the emission wavelength distribution tends to be enlarged if the emission wavelength is increased as will be described below. If a peak emission wavelength is equal to or smaller than 300 nm, the spread of the emission wavelength distribution (full width at half maximum) is controlled to be approximately 20 nm or less in the case in which the off angle is 1°. Consequently, the separation of the peak of the emission wavelength is not generated.

In addition, in the nitride semiconductor ultraviolet light-emitting element, a film thickness of the AlN layer formed on the substrate of the underlying structure portion is preferably equal to or greater than 2.2 μm and is equal to or smaller than 6.6 μm. In the AlN layer of the underlying structure portion which has a greater film thickness, the crystallinity of the n-type AlGaN layer formed on the upper layer tends to be improved more greatly. On the other hand, if the film thickness is excessively increased, there is a tendency that the possibility of occurrence of a crack in the underlying structure portion is increased. By setting the film thickness to be equal to or greater than 2.2 μm and to be equal to or smaller than 6.6 μm, it is possible to obtain the effect of enhancement in the light-emitting output more reliably.

BRIEF DESCRIPTION OF THE DRAWINGS

FIG. 13 is a table showing FWHM of a twist distribution of an n-type cladding layer, a light-emitting output in forward current of 100 mA and FWHM of an emission wavelength distribution according to each of the examples 1 to 3 and the comparative examples 1 to 3.

MODE FOR CARRYING OUT THE INVENTION

Figure 1:
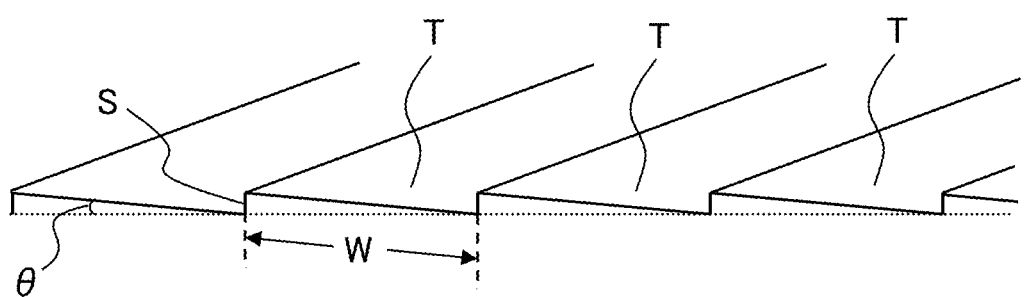
FIG. 1 is an explanatory view schematically showing a state of a substrate surface of a sapphire (0001) substrate inclined at an off angle θ.

An embodiment of a nitride semiconductor ultraviolet light-emitting element according to the present invention (which will be hereinafter referred to as a "light-emitting element") will be described based on the drawings. Referring to the drawings to be used in the following explanation, main parts are exaggerated and the contents of the invention are thus shown schematically for easy understanding of the description. For this reason, a dimension ratio of each portion is not always equal to that of an actual element. In the present embodiment, description will be given on the assumption that a light-emitting element is a light-emitting diode.

Figure 2:
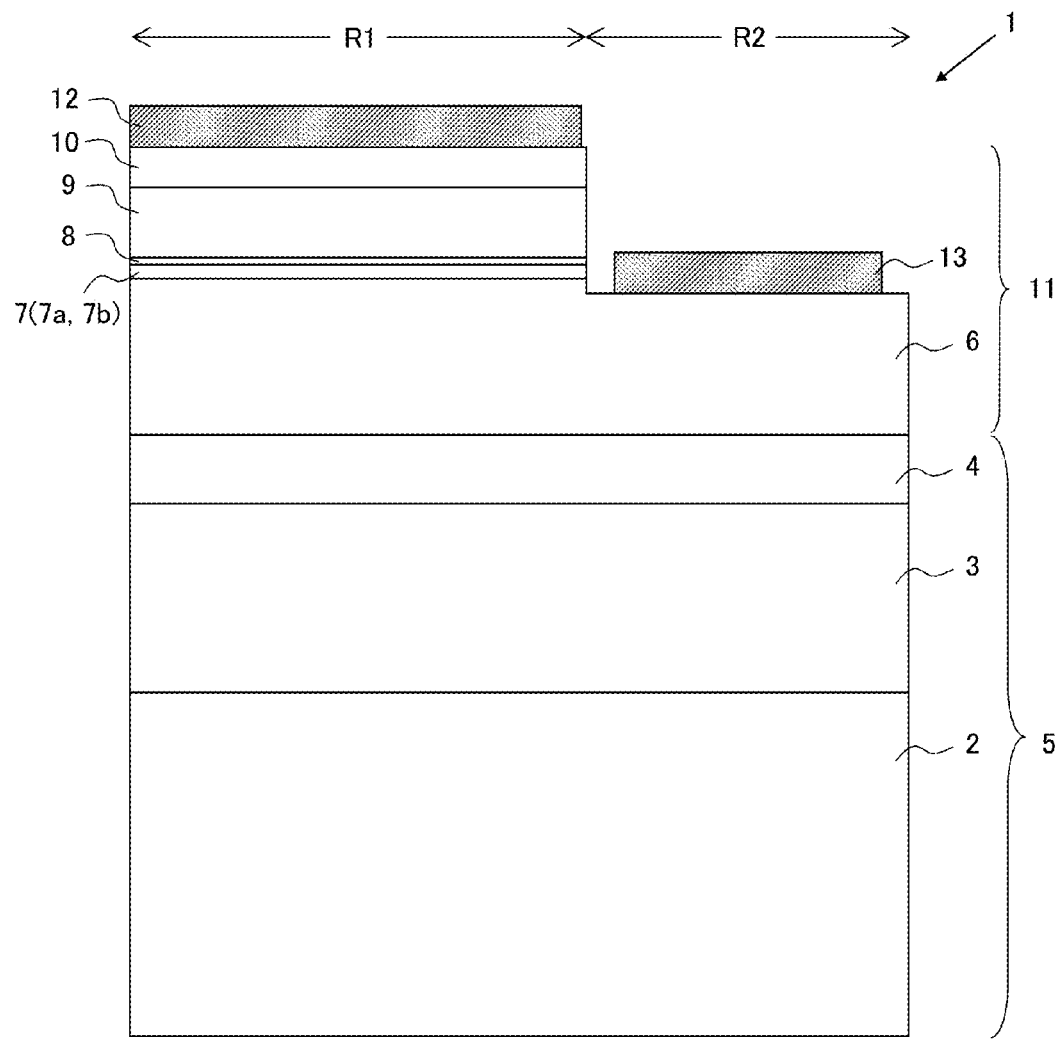
FIG. 2 is a sectional view showing a main part, schematically illustrating a laminated structure according to an embodiment of a nitride semiconductor ultraviolet light-emitting element in accordance with the present invention.

As shown in FIG. 2, a light-emitting element 1 according to the present embodiment has a laminated structure in which a substrate obtained by growing an AlN layer 3 and an AlGaN layer 4 on a sapphire (0001) substrate 2 is used as a template 5 (corresponding to an underlying structure portion), and an n-type cladding layer 6 composed of n-type AlGaN, an active layer 7, an electron blocking layer 8 having a higher Al molar fraction than the active layer 7 and composed of p-type AlGaN, a p-type cladding layer 9 composed of p-type AlGaN and a p-type contact layer 10 composed of p-type GaN are laminated on the template 5 in order. A part of the active layer 7, the electron blocking layer 8, the p-type cladding layer 9 and the p-type contact layer 10 provided on the n-type cladding layer 6 is removed by reactive ion etching or the like until a partial surface of the n-type cladding layer 6 is exposed. A light-emitting element structure portion 11 from the n-type cladding layer 6 to the p-type contact layer 10 is formed in a first region R1 provided on the n-type cladding layer 6. Furthermore, a p electrode 12 composed of Ni/Au is formed on a surface of the p-type contact layer 10 and an n electrode 13 composed of Ti/Al/Ti/Au is formed on a part of a surface of a second region R2 other than the first region R1 of the n-type cladding layer 6, for example. In the present embodiment, the AlN layer 3 subjected to crystal growth at a temperature of approximately 1150 to 1300° C. is used.

In the present embodiment, for reason which will be described below, a slightly inclined substrate obtained by inclining a (0001) surface of a substrate at an off angle which is equal to or greater than 0.6° and is equal to or smaller than 3.0° is used as the sapphire (0001) substrate 2. It is more preferable that the off angle of the slightly inclined substrate is equal to or greater than 1.0° and be equal to or smaller than 2.5°. An inclination direction of the off angle may be an m-axis direction, an a-axis direction or an intermediate direction thereof.

As an example, the active layer 7 has a single layered quantum well structure constituted by an n-type AlGaN barrier layer 7a having a film thickness of 10 nm and an AlGaN well layer 7b having a film thickness of 3.5 nm. The active layer 7 may have double heterojunction structure in which the active layer 7 is interposed with n-type and p-type AlGaN layers having high Al molar fractions at a lower layer and an upper layer, or may have a multi quantum well structure in which the single layered quantum well structure is multilayered.

Each AlGaN layer is formed by the well-known epitaxial growth method such as a metal organic vapor phase epitaxy method (MOVPE) or a molecular beam epitaxy (MBE) method, and Si is used as a donor impurity of an n-type layer, for example, and Mg is used as an acceptor impurity of a p-type layer. An AlN layer and an AlGaN layer which do not specify a conductivity type are undoped layers in which an impurity is not implanted. Referring to AlN molar fractions of the n-type AlGaN layer and the active layer, as an example, the AlGaN layer 4, the n-type cladding layer 6 and the barrier layer 7a have AlN molar fractions which are equal to or higher than 50% and are equal to or lower than 100% (more preferably, are equal to or higher than 55% and are equal to or lower than 90%), and the well layer 7b has an AlN molar fraction which is equal to or higher than 30% and is equal to or lower than 80% (more preferably, is equal to or higher than 35% and is equal to or lower than 70%). In the present embodiment, it is assumed that a peak emission wavelength of the light-emitting element 1 is equal to or greater than 223 nm and is equal to or smaller than 300 nm. In the present embodiment, it is assumed that the light-emitting element 1 is a rear-face output type one in which light emission from the active layer 7 is taken out of the sapphire substrate 2 side. For this reason, it is necessary to set the AlN molar fraction of the AlGaN layer 4 to be higher than that of the well layer 7b. As an example, the AlN molar fractions of the AlGaN layer 4 and the n-type cladding layer 6 are set to be equal to each other. The AlN molar fraction of the AlGaN layer 4 may be set to be higher than that of the n-type cladding layer 6.

Referring to film thicknesses of the respective AlGaN layers in the light-emitting element structure portion other than the active layer 7, for example, the n-type cladding layer 6 has a thickness of 2000 nm, the electron blocking layer 8 has a thickness of 2 nm, the p-type cladding layer 9 has a thickness of 540 nm, and the p-type contact layer 10 has a thickness of 200 nm. Referring to the template 5, moreover, the AlN layer 3 preferably has a film thickness set to be equal to or greater than 2200 nm and be equal to or smaller than 6600 nm, and more preferably equal to or greater than 3000 nm and be equal to or smaller than 6000 nm. The AlGaN layer 4 has a film thickness set to be equal to or greater than 200 nm and be equal to or smaller than 300 nm, for example. In the present embodiment, the n-type cladding layer 6 as the AlGaN layer is formed on the AlGaN layer 4. For this reason, the conductivity type of the AlGaN layer 4 is not of the undoped layer but may be of the n-type layer, and the AlGaN layer 4 may be integrated with the n-type cladding layer 6 to constitute the template 5 by only the AlN layer 3.

Figure 3:
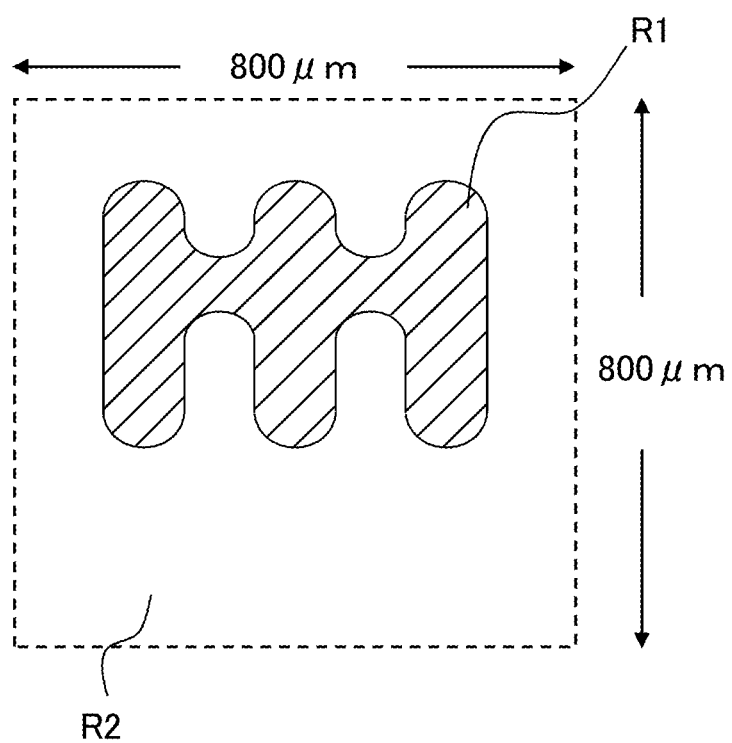
FIG. 3 is a plan view schematically showing a planar structure according to the embodiment of the nitride semiconductor ultraviolet light-emitting element in accordance with the present invention.

FIG. 3 shows an example of a pattern of the light-emitting element 1 seen on a plane. FIG. 3 shows a first region R1 and a second region R2 before the formation of the p electrode 12 and the n electrode 13. As an example, the p electrode 12 is formed over an almost whole surface of the first region R1 and the n electrode 13 is formed over an almost whole surface of the second region R2. Moreover, a chip size of the light-emitting element 1 used in examples which will be described below has a length and a width of 800 μm, and the first region R1 has an area of approximately 168000 μm². The first region R1 shown in FIG. 2 is a part of the first region R1 shown in FIG. 3.

The respective layers of the template 5 and the light-emitting element structure portion 11 in the light-emitting element 1 are formed by the well-known growth method as described above, and the p electrode 12 and the n electrode 13 are formed respectively in the following manner. After a photoresist to be an inversion pattern of each electrode is formed, a multilayered metal film of each electrode is deposited by an electron beam vapor deposition method or the like and the photoresist is removed by lift-off to separate a multilayered metal film on the photoresist, and a heat treatment is performed by RTA (rapid thermal annealing) or the like if necessary.

Figure 4:
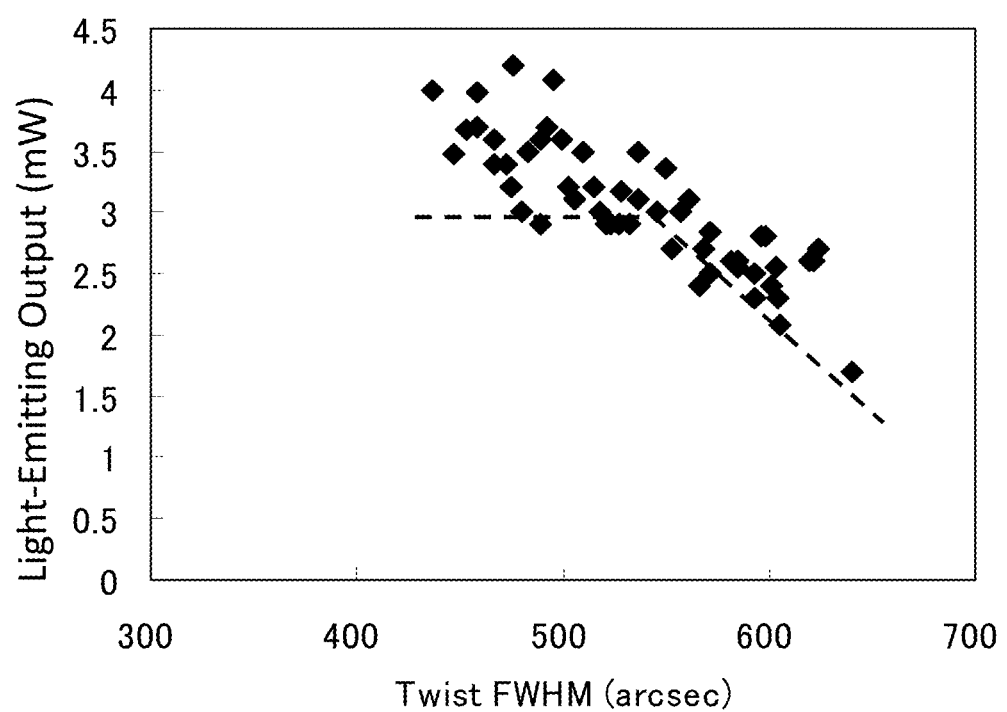
FIG. 4 is a characteristic chart showing a relationship between FWHM of a twist distribution of an n-type cladding layer and a light-emitting output.

Next, a description will be given to measurement data to be a basis of the present invention. FIG. 4 shows first measurement data to be a basis of the present invention. Specifically, FIG. 4 is a plot of measurement values of a FWHM of a twist distribution acquired by evaluating the crystallinity of the n-type AlGaN layer of the n-type cladding layer 6 through an XRC method and a light-emitting output for samples in which the peak emission wavelength of the light-emitting element 1 having the structures shown in FIGS. 2 and 3 ranges from 255 nm to 300 nm. In FIG. 4, an abscissa axis indicates the FWHM (unit: arcsec) and an ordinate axis indicates the light-emitting output (unit: mW). Each of the sapphire (0001) substrates used for the samples has an off angle within a range of 0.15° to 2.0°.

Apparently from the result of the measurement in FIG. 4, there is a tendency that the light-emitting output is reduced if the FWHM of the twist distribution is increased to exceed approximately 550 arcsec, and the light-emitting output is not increased even if the FWHM of the twist distribution is decreased more greatly within a range of approximately 550 arcsec or less. In other words, it is apparent that the crystallinity of the n-type AlGaN layer is enough if the FWHM of the twist distribution of approximately 550 arcsec or less is obtained.

Figure 5:
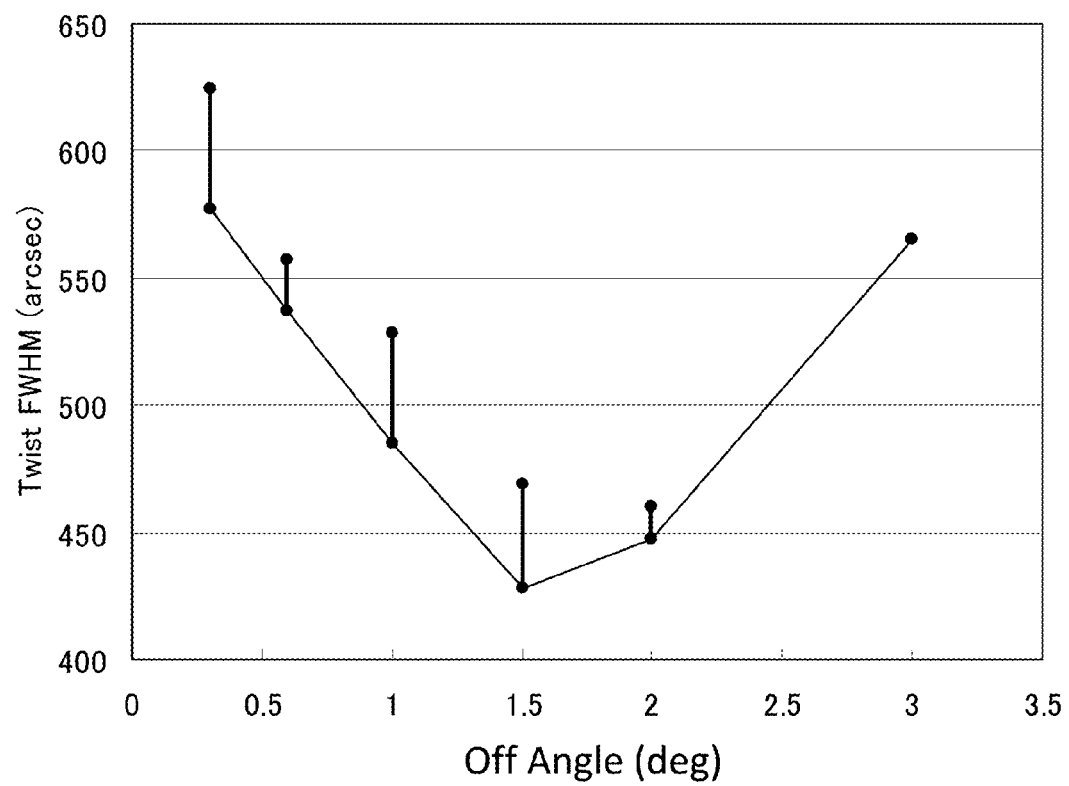
FIG. 5 is a characteristic chart showing a relationship between an off angle of the sapphire (0001) substrate and the FWHM of the twist distribution of the n-type cladding layer.

FIG. 5 shows second measurement data to be a basis of the present invention. Specifically, FIG. 5 is a plot of a minimum value and a median in measurement values of FWHM of a twist distribution at each off angle for six types of samples in which the n-type cladding layer 6 has an AlN molar fraction of 50% or more and an off angle of 0.3°, 0.6°, 1.0°, 1.5°, 2.0° and 3.0°. However, only the minimum value is displayed for the off angle of 3.0°. A structure of the samples of the measurement data shown in FIG. 5 is the same as the samples of the measurement data shown in FIG. 4 except that semiconductor layers to be upper layers on the n-type cladding layer 6 and the respective electrodes are not formed.

Apparently from the result of the measurement in FIG. 5, the FWHM of the twist distribution is reduced if the off angle is increased from 0.3° to 1.5°, and conversely the FWHM of the twist distribution is increased if the off angle is increased from 1.5° to 3.0°. Moreover, it is apparent that the FWHM of the twist distribution is equal to or smaller than approximately 550 arcsec within a range in which the off angle is equal to or greater than 0.6° and is equal to or smaller than 3.0°, and the light-emitting output can be enhanced through collation with the result of the measurement in FIG. 4.

Figure 6:
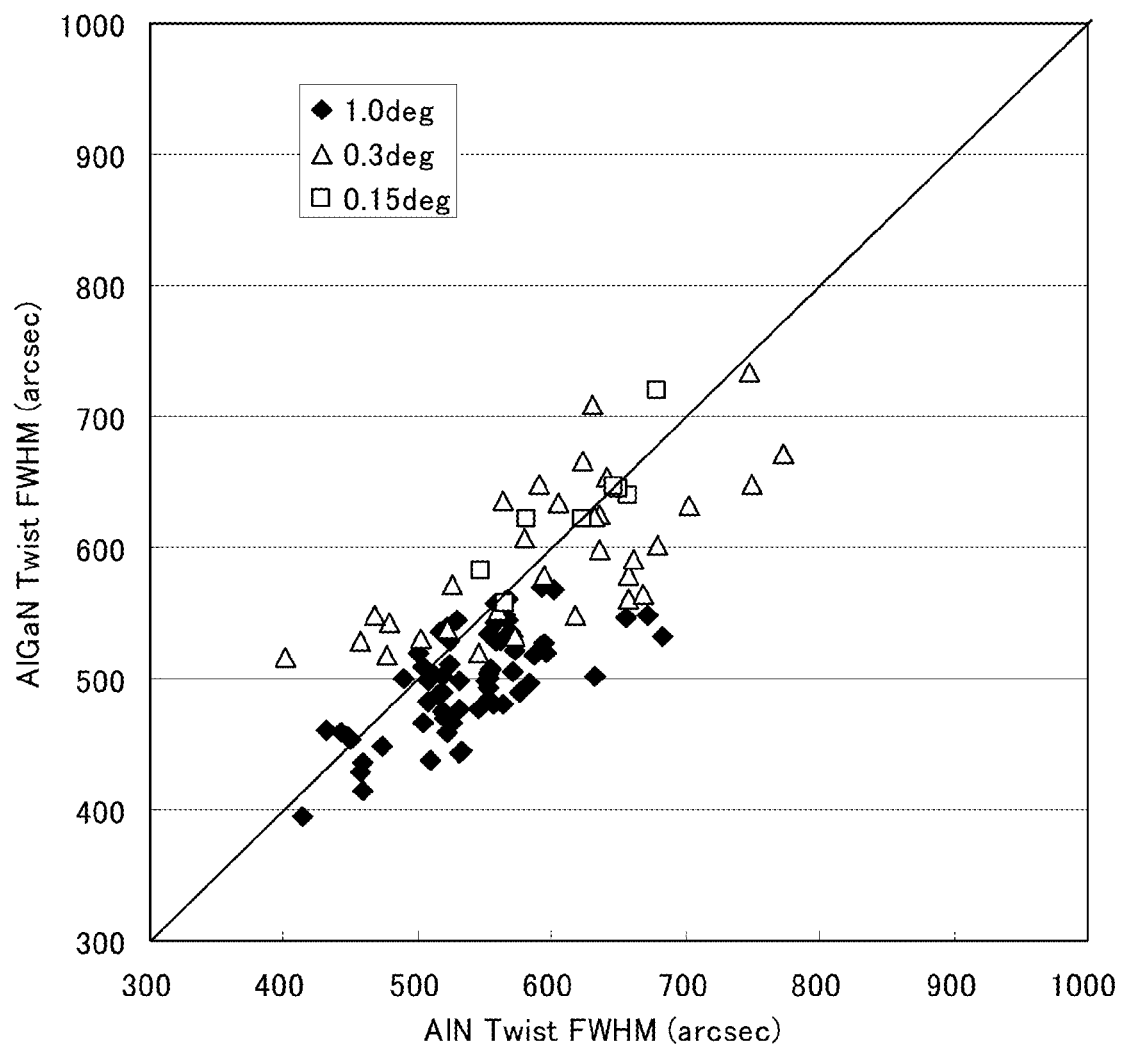
FIG. 6 is a characteristic chart showing a relationship between the FWHM of the twist distribution of the n-type cladding layer and FWHM of a twist distribution of an AlN layer depending on a difference in the off angle of the sapphire (0001) substrate.

FIG. 6 shows third measurement data to be a basis of the present invention. Specifically, FIG. 6 is a plot of the measurement values of FWHM of a twist distribution of each of the AlN layer 3 and the n-type cladding layer 6 at each off angle for three types of samples in which the n-type cladding layer 6 has an AlN molar fraction of 50% or more and an off angle of 0.15°, 0.3° and 1.0° (structures of the samples are the same as those of the samples of the measurement data shown in FIG. 5). In FIG. 6, an ordinate axis indicates the FWHM of the n-type cladding layer 6 and an abscissa axis indicates the FWHM of the AlN layer 3. A solid line drawn obliquely in FIG. 6 is a line connecting points where the FWHMs of the AlN layer 3 and the n-type cladding layer 6 have the same value, and indicates that the crystallinity is enhanced more greatly in the n-type cladding layer 6 to be the upper layer on the AlN layer 3 in the samples on the lower side of the solid line, and conversely the crystallinity is reduced more greatly in the n-type cladding layer 6 to be the upper layer on the AlN layer 3 in the samples on the upper side of the solid line.

Apparently from the result of the measurement in FIG. 6, the FWHM of the AlN layer 3 is distributed into 564 to 679 arcsec and the FWHM of the n-type cladding layer 6 is changed into 558 to 719 arcsec in the samples having the off angle of 0.15°, and the crystallinity is reduced in most of the samples. It is apparent that the FWHM of the AlN layer 3 is distributed into 402 to 773 arcsec and the FWHM of the n-type cladding layer 6 is changed into 517 to 733 arcsec in the samples having the off angle of 0.3°, and the crystallinity is reduced in about a half of the samples and the crystallinity is enhanced in about another half of samples. On the other hand, it is apparent that the FWHM of the AlN layer 3 is distributed into 410 to 683 arcsec and the FWHM of the n-type cladding layer 6 is changed into 394 to 568 arcsec in the samples having the off angle of 1.0°, and the crystallinity is enhanced in a majority of the samples and the FWHM is equal to or smaller than approximately 550 arcsec in almost all the samples.

Figure 7:
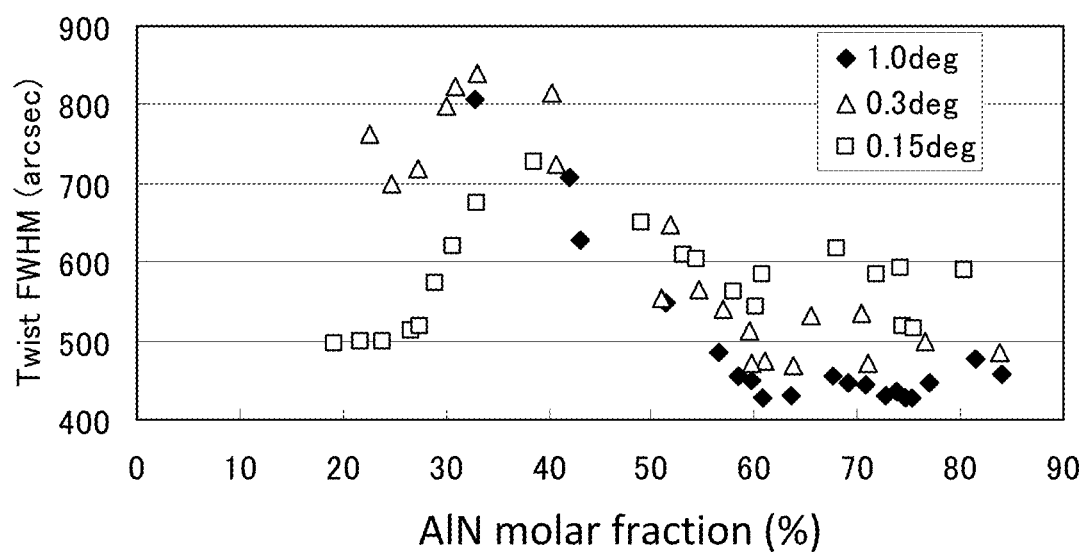
FIG. 7 is a characteristic chart showing a relationship between an AlN molar fraction of the n-type cladding layer and the FWHM of the twist distribution.

FIG. 7 shows fourth measurement data to be a basis of the present invention. FIG. 7 is plot of measurement values of the FWHM of the twist distribution of the n-type cladding layer 6 for three types of samples having the off angle of 0.15°, 0.3° and 1.0° (structures of the samples are the same as the samples of the measurement data shown in FIGS. 5 and 6) in which the AlN molar fraction of the n-type cladding layer 6 is changed wholly within a range of 19.2% to 84%. In FIG. 7, an ordinate axis indicates the FWHM of the n-type cladding layer 6 and an abscissa axis indicates the AlN molar fraction of the n-type cladding layer 6.

Apparently from the result of the measurement in FIG. 7, the sample having the off angle of 0.15° has a tendency that the FWHM of the twist distribution is increased and the crystallinity of the n-type cladding layer 6 is reduced with an increase in the AlN molar fraction of the n-type cladding layer 6 within a range in which the AlN molar fraction is equal to or lower than approximately 40%, and conversely the FWHM of the twist distribution is decreased and the crystallinity of the n-type cladding layer 6 is enhanced with the increase in the AlN molar fraction within a range in which the AlN molar fraction is equal to or higher than approximately 40%, and furthermore it is necessary to limit the AlN molar fraction to be equal to or lower than approximately 28% in order to implement the FWHM of approximately 550 arcsec or less. The sample having the off angle of 0.3° has a tendency that the FWHM of the twist distribution is slightly increased and the crystallinity of the n-type cladding layer 6 is reduced with the increase in the AlN molar fraction within a range in which the AlN molar fraction of the n-type cladding layer 6 is equal to or lower than approximately 35%, and conversely the FWHM of the twist distribution is decreased and the crystallinity of the n-type cladding layer 6 is enhanced with the increase in the AlN molar fraction within a range in which the AlN molar fraction is equal to or higher than approximately 35%. Although it is necessary to limit the AlN molar fraction to be equal to or higher than approximately 55% in order to implement the FWHM of approximately 550 arcsec or less in the sample having the off angle of 0.3°, it is impossible to expect a high yield. On the other hand, apparently, the sample having the off angle of 1.0° has a tendency that the FWHM of the twist distribution is decreased and the crystallinity of the n-type cladding layer 6 is enhanced with the increase in the AlN molar fraction of the n-type cladding layer 6 within a range in which the AlN molar fraction is equal to or higher than approximately 30%, and furthermore the FWHM of approximately 550 arcsec or less can be implemented with a high yield within a range in which the AlN molar fraction of the n-type cladding layer 6 is equal to or higher than approximately 50%.

Apparently from the results of the measurement shown in FIGS. 4 to 7, the n-type cladding layer 6 having the FWHM of the twist distribution of approximately 550 arcsec or less and excellent crystallinity can be implemented with a high yield so that a high light-emitting output can be stably obtained because the AlN molar fraction of the n-type cladding layer 6 is set to be equal to or higher than 50% and the off angle of the sapphire (0001) substrate is set to be equal to or greater than 0.6° and to be equal to or smaller than 3.0° in the light-emitting element 1 according to the present embodiment.

Apparently from the result of the measurement shown in FIG. 5, moreover, it is possible to further reduce the FWHM of the twist distribution from approximately 550 arcsec, thereby obtaining a high light-emitting output more stably by setting the off angle of the sapphire (0001) substrate into a range of 1.0° to 2.5°.

Apparently from the result of the measurement shown in FIG. 7, furthermore, it is preferable that the off angle of the sapphire (0001) substrate has a small value, that is, approximately 0.15° in the case in which the AlN molar fraction of the n-type cladding layer 6 is equal to or lower than 28%, that is, the emission wavelength from the active layer 7 is great also in the same nitride semiconductor ultraviolet light-emitting element, and conversely it is preferable that the off angle considerably exceeds the conventionally used range so as to be equal to or greater than 0.6° and be equal to or smaller than 3.0° if the AlN molar fraction of the n-type cladding layer 6 is equal to or higher than 50%, that is, the emission wavelength from the active layer 7 is small (approximately 300 nm or less).

Figure 8:
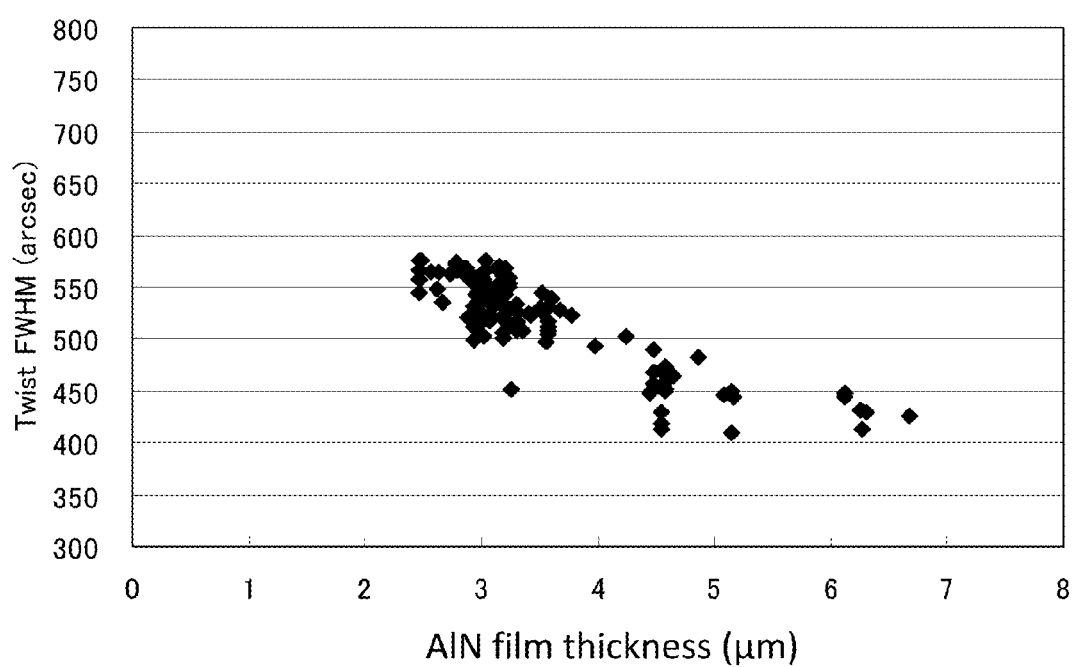
FIG. 8 is a characteristic chart showing a relationship between a film thickness of the AlN layer and the FWHM of the twist distribution of the n-type cladding layer.

FIG. 8 shows a result of measurement for the film thickness dependency of an AlN layer for samples in which the AlN molar fraction of the n-type cladding layer 6 is equal to or higher than 50% and the off angle is 1.0° (a structure of each of the samples is the same as that of each of the samples of the measurement data shown in FIGS. 5 to 7). It is apparent that approximately 550 arcsec or less can be implemented as the FWHM of the twist distribution of the n-type cladding layer 6 with its film thickness within a range of 2200 nm to 6600 nm.

Next, FIGS. 9 to 12 show results obtained by measuring light-emitting outputs and wavelength distributions in two examples 1 and 2 of the light-emitting element 1 according to the present embodiment in which the off angle of the sapphire (0001) substrate 2 is 1.0° and an example 3 of the light-emitting element 1 according to the present embodiment in which the off angle is 0.6°, and two comparative examples 1 and 2 in which the off angle of the sapphire (0001) substrate 2 is 0.3° and a comparative example 3 in which the off angle is 0.15°. In the example 1 and the comparative examples 1 and 3, only the off angles are different from each other, the other element structures are the same, the AlN molar fractions of the n-type cladding layer 6 and the well layer 7*b* are 60% and 35% respectively, and emission wavelengths approximate to each other (a first emission wavelength group). In the examples 2 and 3 and the comparative example 2, only the off angles are different from each other, the other element structures are the same, the AlN molar fractions of the n-type cladding layer 6 and the well layer 7*b* are 70% and 55% respectively, and emission wavelengths approximate to each other (a second emission wavelength group).

Figure 9:
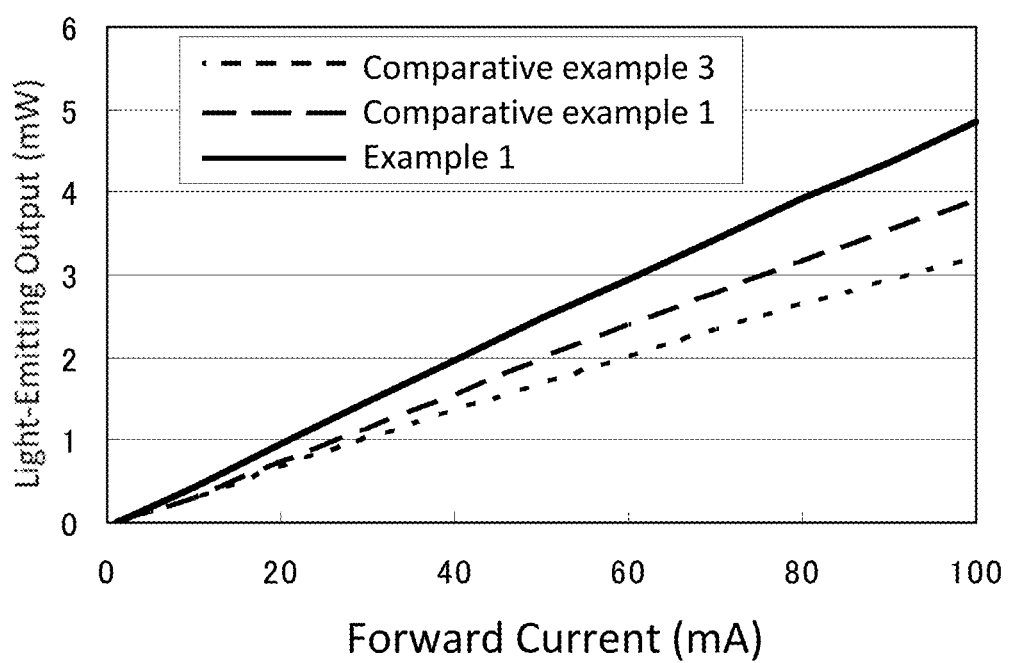
FIG. 9 is a characteristic chart showing a relationship between a light-emitting output and forward current according to each of an example 1 and comparative examples 1 and 3.
Figure 10:
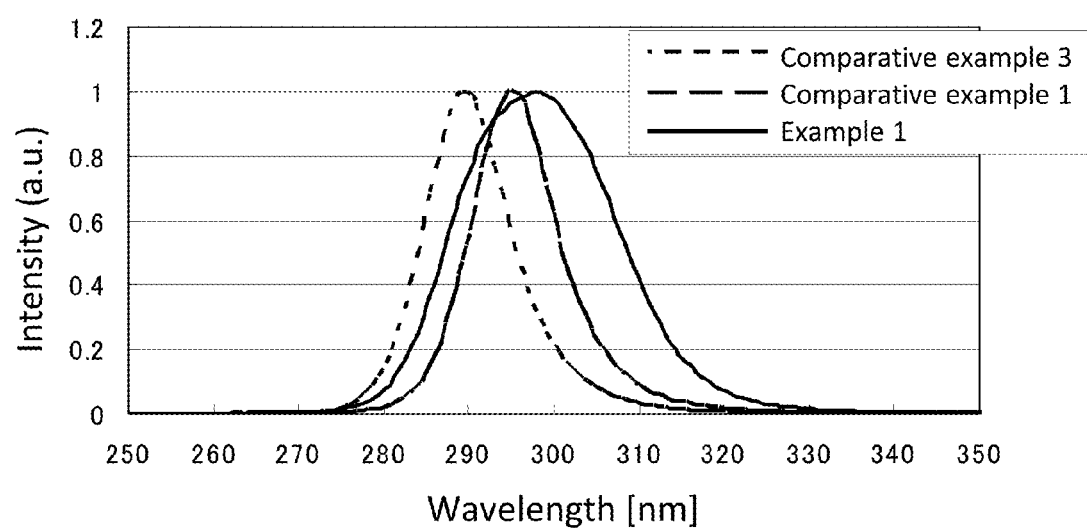
FIG. 10 is a characteristic chart showing emission wavelength characteristics according to the example 1 and the comparative examples 1 and 3.
Figure 11:
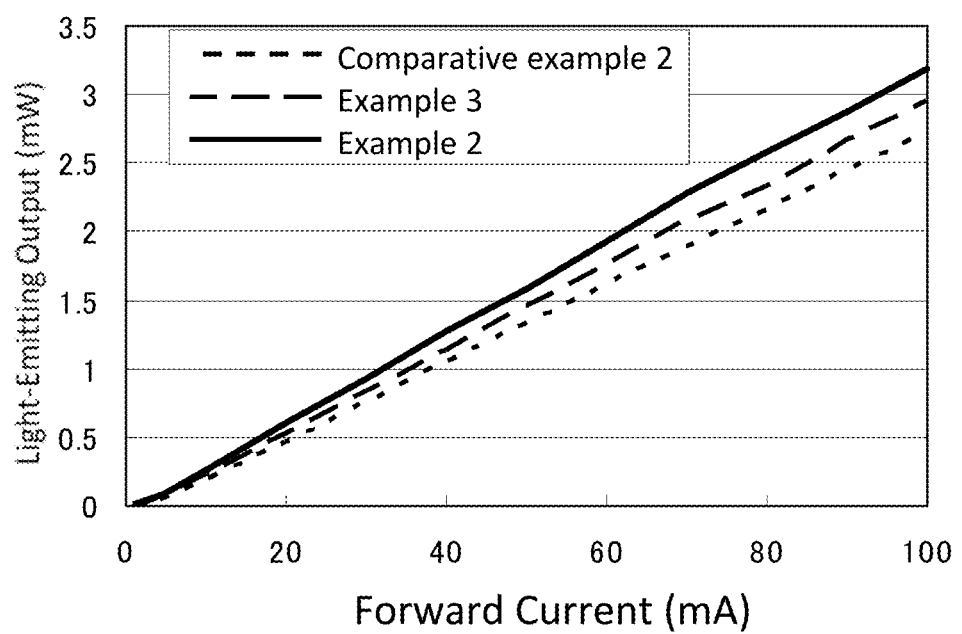
FIG. 11 is a characteristic chart showing a relationship between a light-emitting output and forward current according to each of examples 2 and 3 and comparative example 2.
Figure 12:
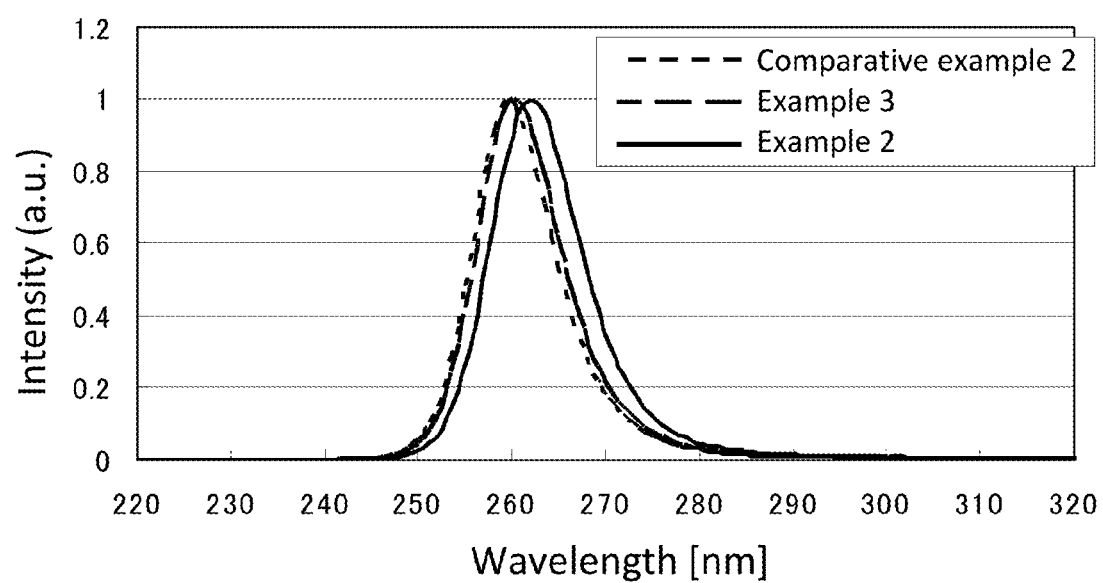
FIG. 12 is a characteristic chart showing emission wavelength characteristics according to the examples 2 and 3 and the comparative example 2.

FIG. 9 shows a light-emitting output characteristic indicative of a relationship between a light-emitting output and forward current in each of the example 1 and the comparative examples 1 and 3, and FIG. 10 shows an emission wavelength characteristic according to each of the example 1 and the comparative examples 1 and 3. FIG. 11 shows a light-emitting output characteristic indicative of a relationship between a light-emitting output and forward current in each of the examples 2 and 3 and the comparative example 2, and FIG. 12 shows an emission wavelength characteristic according to each of the examples 2 and 3 and the comparative example 2. In FIGS. 10 and 12, an ordinate axis for an emission wavelength characteristic indicates an emission intensity normalized by setting a peak output to be one. Moreover, FIG. 13 collectively shows, in a table, FWHM of the twist distribution of the n-type cladding layer 6, a light-emitting output in forward current of 100 mA, and FWHM of an emission wavelength distribution according to each of the examples 1 to 3 and the comparative examples 1 to 3.

It is apparent from FIGS. 9 and 11 that the light-emitting output is increased when the off angle is increased in the respective emission wavelength groups, even if the same forward current is applied.

Furthermore, it is apparent from FIGS. 10 and 12 that the emission wavelength distribution spreads when the off angle is increased to exceed 0.3° in the respective emission wavelength groups. In the two emission wavelength groups, it is apparent that the spread of the emission wavelength distribution is suppressed in the second emission wavelength group having a smaller emission wavelength. Although there is a tendency that the peak emission wavelength is increased when the off angle is increased in the respective emission wavelength groups, it is apparent that a change in the peak emission wavelength is suppressed with a smaller emission wavelength. In detail, in FIG. 10, in the example 1 with the off angle of 1.0°, in comparison with the comparative example 3 with the off angle of 0.15°, the peak emission wavelength is greater by approximately 15 nm, that is, approximately 300 nm, the FWHM of the emission wavelength distribution is increased to be approximately 18 nm which is approximately 1.5 times as great as that in the comparative example 3 and the separation of the peak of the emission wavelength is not observed. In FIG. 12, in the example 2 having the off angle of 1.0°, in comparison with the comparative example 2 with the off angle of 0.3°, the peak emission wavelength is slightly greater by approximately 2.0 nm, that is, approximately 260 nm, the FWHM of the emission wavelength distribution is increased to be approximately 12 nm which is approximately 1.2 times as great as that of the comparative example 2, and enlargement is suppressed to be approximately 1.2 times as great as that in the comparative example 2.

The spread of the emission wavelength distribution observed in FIGS. 10 and 12 is caused by enlargement of the step of the sapphire (0001) substrate 2, occurrence of the segregation of Ga in the composition of the AlGaN layer in the active layer 7 of the light-emitting element structure portion 11 formed on the substrate 2, and formation of the AlGaN region having a high AlN molar fraction and the AlGaN region having a low AlN molar fraction along the step portion when the off angel is increased as described above.

From the measurement data, the following is apparent. In the case that the AlN molar fraction of the n-type cladding layer 6 is equal to or higher than 50%, that is, the emission wavelength from the active layer 7 is small (approximately 300 nm or less), the light-emitting output can be increased by setting the off angle of the sapphire (0001) substrate to be equal to or greater than 0.6° and to be equal to or smaller than 3.0° considerably beyond the conventionally used range, although the enlargement of the FWHM of the emission wavelength distribution is slightly caused.

The embodiment of the light-emitting element 1 has been described above in detail. Although the description has been given by taking the light-emitting element structure portion 11 shown in FIG. 2 as an example of the light-emitting element structure portion constituting the light-emitting element 1 in the embodiment, the laminated structure, the electrode structure, the film thickness, the AlN molar fraction of the AlGaN layer and the like in the description are illustrative and the light-emitting element structure portion 11 is not restricted to the specific example. Furthermore, the shape of the light-emitting element 1 seen on a plane is not restricted to the shape shown in FIG. 3.

In particular, the measurement data shown in FIGS. 5 to 8 are related to the samples in which the element structure of the upper layer on the n-type cladding layer 6 is not formed, and indicate that a relationship between the off angle and the crystallinity of the n-type cladding layer 6 (the FWHM of the twist distribution) is established if the AlN molar fraction of the n-type cladding layer 6 is equal to or higher than 50% regardless of the element structure of the light-emitting element structure portion 11. Enhancement in a light-emitting characteristic with improvement in the crystallinity of the n-type cladding layer 6 can also be expected in other light-emitting element structures.

INDUSTRIAL APPLICABILITY

The nitride semiconductor ultraviolet light-emitting element according to the present invention can be utilized in a light-emitting diode in which an AlN molar fraction of an n-type cladding layer is equal to or higher than 50% or the like, and is effective for improving a light-emitting output.

EXPLANATION OF REFERENCES

1: nitride semiconductor ultraviolet light-emitting element
2: sapphire (0001) substrate
3: AlN layer
4: AlGaN layer
5: template (underlying structure portion)
6: n-type cladding layer (n-type AlGaN)
7: active layer
7*a*: barrier layer
7*b*: well layer
8: electron blocking layer (p-type AlGaN)
9: p-type cladding layer (p-type AlGaN)
10: p contact layer (p-type GaN)
11: light-emitting element structure portion
12: p electrode
13: n electrode
R1: first region
R2: second region
S: step
T: terrace surface

The invention claimed is:

1. A method of manufacturing a nitride semiconductor ultraviolet light-emitting element comprising:
   a step of growing an AlN layer as an AlN crystal directly on a (0001) surface of a sapphire (0001) substrate and forming an underlying structure portion including the substrate and the AlN layer; and
   a step of forming a light-emitting element structure portion on a crystal surface of the underlying structure portion, the light-emitting element structure portion including an n-type cladding layer of an n-type AlGaN based semiconductor layer, an active layer having an AlGaN based semiconductor layer, and a p-type cladding layer of a p-type AlGaN based semiconductor layer;
   wherein the (0001) surface of the substrate is inclined at an off angle which is equal to or greater than 0.6° and is equal to or smaller than 3.0°; and
   an AlN molar fraction of the n-type cladding layer is equal to or higher than 50%.

2. The method of manufacturing a nitride semiconductor ultraviolet light-emitting element according to claim 1, wherein the off angle is equal to or greater than 0.6° and is equal to or smaller than 2.0°.

3. The method of manufacturing a nitride semiconductor ultraviolet light-emitting element according to claim 1, wherein the off angle is equal to or greater than 1.0° and is equal to or smaller than 2.5°.

4. The method of manufacturing a nitride semiconductor ultraviolet light-emitting element according to claim 1, wherein in the step of forming the underlying structure portion, the AlN layer is grown at a temperature of 1150 to 1300° C.

5. The method of manufacturing a nitride semiconductor ultraviolet light-emitting element according to claim 1, wherein in the step of forming the underlying structure portion, the AlN layer is grown until a film thickness of the AlN layer is equal to or greater than 2.2 μm and is equal to or smaller than 6.6 μm.

* * * * *